(12) United States Patent
Abraham et al.

(10) Patent No.: US 10,651,099 B2
(45) Date of Patent: May 12, 2020

(54) NON-DESTRUCTIVE TESTING OF INTEGRATED CIRCUIT CHIPS

(71) Applicant: INTERNATIONAL BUSINESS MACHINES CORPORATION, Armonk, NY (US)

(72) Inventors: David W. Abraham, Croton, NY (US); John M. Cotte, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/813,547

(22) Filed: Nov. 15, 2017

(65) Prior Publication Data
US 2019/0013252 A1 Jan. 10, 2019

Related U.S. Application Data

(63) Continuation of application No. 15/645,104, filed on Jul. 10, 2017.

(51) Int. Cl.
*H01L 21/66* (2006.01)
*H01L 23/00* (2006.01)
(Continued)

(52) U.S. Cl.
CPC ............ *H01L 22/32* (2013.01); *G01R 1/0483* (2013.01); *G01R 31/2884* (2013.01); *G01R 31/2886* (2013.01); *G01R 31/2889* (2013.01); *G01R 31/2894* (2013.01); *G01R 31/31713* (2013.01); *H01L 21/02057* (2013.01);
(Continued)

(58) Field of Classification Search
CPC ......... H01L 22/32; H01L 22/20; H01L 24/06; H01L 24/16; H01L 24/81; H01L 2224/0401; H01L 2224/0603; H01L 2224/81191; H01L 2224/0392; H01L 2224/81815; H01L 22/14; H01L 2224/16227; H01L 2224/16225; H01L 2224/81992; H01L 2224/81203; H01L 24/03; H01L 24/13; G01R 31/2886;
(Continued)

(56) References Cited

U.S. PATENT DOCUMENTS 5,293,047 A 3/1994 Matsuda
5,374,893 A * 12/1994 Koopman .......... G01R 31/2863
324/750.05
(Continued)

OTHER PUBLICATIONS

David W. Abraham, et al., Pending U.S. Appl. No. 15/645,104, entitled "Non-Destructive Testing of Ntegrated Circuit Chips," filed Jul. 10, 2017.
(Continued)

*Primary Examiner* — Michael M Trinh

(57) ABSTRACT

Semiconductor devices and electronics packaging methods include integrated circuit chips having redundant signal bond pads along with signal bond pads connected to the same signal port for non-destructive testing of the integrated circuit chips prior to packaging. Electrical testing is made via the redundant signal bond after which qualified integrated circuit chips can be attached to a pristine and bumped final interposer or printed circuit board to provide increased reliability to the assembled electronic package.

4 Claims, 1 Drawing Sheet

(51) Int. Cl.
*G01R 31/28* (2006.01)
*H01L 21/02* (2006.01)
*H01L 21/67* (2006.01)
*G01R 1/04* (2006.01)
*G01R 31/317* (2006.01)

(52) U.S. Cl.
CPC ........ *H01L 21/67271* (2013.01); *H01L 22/20* (2013.01); *H01L 24/03* (2013.01); *H01L 24/06* (2013.01); *G01R 1/0466* (2013.01); *H01L 24/13* (2013.01); *H01L 24/16* (2013.01); *H01L 24/81* (2013.01); *H01L 2224/0345* (2013.01); *H01L 2224/03462* (2013.01); *H01L 2224/0401* (2013.01); *H01L 2224/0567* (2013.01); *H01L 2224/0568* (2013.01); *H01L 2224/05099* (2013.01); *H01L 2224/05568* (2013.01); *H01L 2224/05605* (2013.01); *H01L 2224/05609* (2013.01); *H01L 2224/05611* (2013.01); *H01L 2224/05617* (2013.01); *H01L 2224/05618* (2013.01); *H01L 2224/05624* (2013.01); *H01L 2224/05663* (2013.01); *H01L 2224/05666* (2013.01); *H01L 2224/05672* (2013.01); *H01L 2224/05676* (2013.01); *H01L 2224/05678* (2013.01); *H01L 2224/05679* (2013.01); *H01L 2224/05681* (2013.01); *H01L 2224/05683* (2013.01); *H01L 2224/05684* (2013.01); *H01L 2224/0603* (2013.01); *H01L 2224/131* (2013.01); *H01L 2224/16225* (2013.01); *H01L 2224/16238* (2013.01); *H01L 2224/81191* (2013.01); *H01L 2224/81192* (2013.01); *H01L 2224/81203* (2013.01); *H01L 2224/81815* (2013.01); *H01L 2924/14* (2013.01)

(58) Field of Classification Search
CPC .............. G01R 31/2896; G01R 1/0416; G01R 31/2894; G01R 31/31713
See application file for complete search history.

(56) References Cited

U.S. PATENT DOCUMENTS

| | | | |
|---|---|---|---|
| 5,506,499 A | 4/1996 | Puar | |
| 5,644,143 A * | 7/1997 | Rostoker | H01L 21/76891 257/30 |
| 5,891,745 A | 4/1999 | Dunaway et al. | |
| 6,221,682 B1 | 4/2001 | Danziger | |
| 6,392,428 B1 | 5/2002 | Kline et al. | |
| 6,452,807 B1 | 9/2002 | Barrett | |
| 6,515,495 B2 | 2/2003 | Richter | |
| 6,617,181 B1 | 9/2003 | Wright et al. | |
| 6,630,837 B2 | 10/2003 | Wark | |
| 6,822,469 B1 * | 11/2004 | Kline | G01R 1/0408 324/750.05 |
| 7,235,412 B1 | 7/2007 | Mardi et al. | |
| 7,342,248 B2 * | 3/2008 | Sorimachi | H01L 22/32 257/48 |
| 7,352,196 B2 * | 4/2008 | Khandros | H05K 3/4015 324/756.03 |
| 7,394,161 B2 * | 7/2008 | Kuo | H01L 22/32 257/780 |
| 7,507,655 B2 | 3/2009 | Sakaguchi et al. | |
| 7,768,284 B2 * | 8/2010 | Groeninger | G01R 1/0466 324/762.01 |
| 8,237,274 B1 | 8/2012 | Rahman | |
| 8,987,014 B2 | 3/2015 | Pendse | |
| 9,207,275 B2 | 12/2015 | Bartley et al. | |
| 9,343,419 B2 | 5/2016 | Yu et al. | |
| 2004/0069988 A1 | 4/2004 | Lin | |
| 2007/0218573 A1 * | 9/2007 | Mardi | H01L 22/32 438/18 |
| 2016/0215240 A1 * | 7/2016 | Acra | H01L 21/31133 |

OTHER PUBLICATIONS

List of IBM Patents or Patent Applications Treated as Related; (Appendix P), Date Filed Nov. 15, 2017; 2 pages.

* cited by examiner

NON-DESTRUCTIVE TESTING OF INTEGRATED CIRCUIT CHIPS

DOMESTIC PRIORITY

This application is a CONTINUATION of U.S. Non-Provisional application Ser. No. 15/645,104, filed Jul. 10, 2017, which is incorporated by reference herein in its entirety.

STATEMENT REGARDING FEDERALLY SPONSORED RESEARCH OR DEVELOPMENT

This invention was made with Government support under Contract No. H98230-13-D-0173 by the National Security Agency. The Government has certain rights to this invention.

BACKGROUND

The present invention generally relates to fabrication methods and resulting structures for semiconductor devices. More specifically, the present invention relates to electronics packaging methods and structures including redundant bond pads for non-destructive testing of integrated circuit chips.

In order to minimize the shipment of modules with defective integrated circuit chips, integrated circuit chips are subjected to tests during various stages of fabrication prior to and subsequent to dicing. It is particularly difficult and expensive to test integrated circuit chips after dicing. One reason is that an integrated circuit chip must be tested through its pins and contacts or pads before populating the carrier, card, board, or the like. The chip is then tested as part of an assembly and when complete, the chip is removed from the card or board. This is not a simple "desoldering" step, especially in the case of high input/output (I/O) density chips, encapsulation chip connect technologies, and multi-chip modules. In these instances, the chip site is redressed and a new chip installed for testing.

SUMMARY

The present invention is generally directed to semiconductor structures and methods for forming the semiconductor structures. A non-limiting example method of testing an integrated circuit chip includes fabricating an integrated circuit chip including at least one redundant signal bond pad and at least one final signal bond pad, wherein the at least one redundant signal bond pad and at least one final signal bond pad are connected to the same signal port. The at least one redundant signal bond pad contacts a test fixture in electrical communication with electrical evaluation equipment. The chip is electrically tested with the electrical evaluation equipment.

A non-limiting example integrated circuit chip includes at least one redundant signal bond configured for electrical testing using a test fixture and at least one final signal bond pad configured for packaging to an interposer. The at least one redundant signal bond pad and the at least one signal bond pad are coupled to the same signal port.

A non-limiting example method of packaging an integrated circuit chip includes fabricating an integrated circuit chip including at least one redundant signal bond pad and at least one final signal bond pad, wherein the at least one redundant signal bond pad and at least one final signal bond pad are connected to the same signal port. A test interposer including a test socket is provided in electrical communication with a bond pad including a solder bump thereon, wherein the test socket coupled to an electrical evaluation device is in electrical communication with the at least one redundant signal bond pad. The at least one redundant signal bond pad of the integrated circuit chip is aligned with the solder bump on the test interposer and the integrated circuit chip and test interposer subjected to thermal compression bonding to bond the solder bump to the at least one redundant bond pad. The integrated circuit chip is electrically tested with the electrical evaluation device. The test interposer is removed from the integrated circuit chip by heating the integrated circuit chip to a temperature effective to reflow the solder bump. The integrated circuit chip is attached to a final interposer, wherein the final interposer includes a solder bump disposed on a final signal bond pad thereon and the signal bond pad on the integrated circuit chip is thermally compression bonded to the solder bump.

A non-limiting example semiconductor device includes an integrated circuit chip including a first signal bond pad and a second signal bond pad connected to the same signal port. The first signal bond pad has a greater lateral width than the second signal bond pad and is configured for testing the integrated circuit chip prior to packaging. The second signal bond pad is configured for packaging with an interposer or a printed circuit board.

A non-limited example method of testing an integrated circuit chip including fabricating an integrated circuit chip comprising at least one redundant signal bond pad and at least one final signal bond pad. The at least one redundant signal bond pad and at least one final signal bond pad are connected to the same signal port. The at least one redundant signal bond pad is contacted with a probe in electrical communication with electrical evaluation equipment. The integrated circuit chip is electrically tested with the electrical evaluation equipment.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
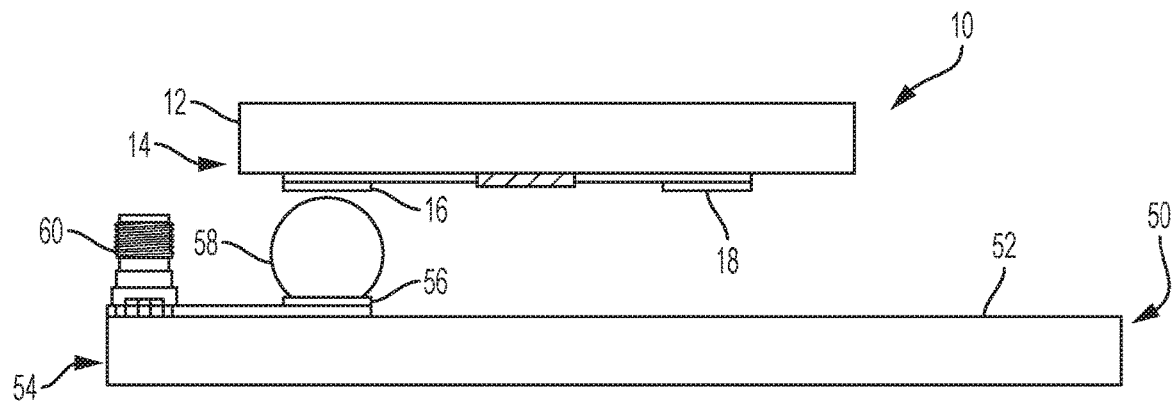
FIG. 1 is a sectional view depicting a semiconductor device after a fabrication operation according to embodiments of the invention.

Exemplary embodiments of the invention will now be discussed in further detail with regard to semiconductor devices and methods of manufacturing the same and, in particular, to non-destructive testing methods and integrated circuit chip structures including redundant signal bond pads in close proximity to signal bond pads connected to the same signal port. Electrical testing can be performed using the redundant signal bond pads for selecting out the qualified integrated circuit chips that will undergo the packaging process and can generally be conducted by temporary contact to the redundant signal bond pads with a test fixture such as a standard bump pad bond contact using a test interposer or printed circuit board, a wirebond contact using a test interposer or printed circuit board, for example, or a probe tip contact.

The integrated circuit chips having the redundant signal bond pads in close proximity to signal bond pads connected to the same signal port and the different test fixtures provide non-destructive testing of the integrated circuit chips prior to packaging. The integrated circuit chips can include a processor (e.g., a microprocessor or digital signal processor), memory (e.g., dynamic random access memory (DRAM) or static RAM (SRAM)), programmable logic (e.g., a field programmable gate array (FPGA) or a complex programmable logic device (CPLD)), a mask-programmable logic device (e.g., application specific integrated circuit (ASIC) or application specific standard product (ASSP)), or like-type integrated circuit devices known in the art.

Integrated circuit chips are typically produced by creating several identical devices on a semiconductor substrate, using known techniques of photolithography, deposition, and the like. One type of semiconductor die includes bond pads distributed across the entire surface. The bond pads are in electrical communication with metal layers disposed on the die and with transistors, resistors, and other electronic circuits integrated within the die. The integrated circuit chip typically has a plurality of I/O contacts (i.e., pads) providing signal, power, and ground contacts. These contacts are generally chosen from the group consisting of solder, low melting point alloys having a melting point below 200 degrees Celsius, brazing alloys, or other conductive metals including superconducting metals. As noted above, in the present invention, the integrated circuit chip further includes at least one redundant signal bond pad in addition to the at least one signal bond pad, wherein the at least one redundant signal bond pad and the at least one signal bond pad are connected to the same signal port. In this manner, the integrated circuit chip can be tested using an electrical interface via the redundant single bond pad and packaged using the final signal bond pad (i.e., the non-redundant bond pad). High confidence in chip performance results since the same signal port is being used for electrical testing as it is for electronic packaging.

In one or more embodiments, the method and structure for testing an integrated circuit semiconductor chip is provided with reference to an electrical interface such as an interposer. The term "interposer" as used herein is an intermediate layer often used for interconnection routing or as a ground/power plane. Sometimes the terms 'substrate' and 'interposer' are used to refer to the same thing.

There are several types of package substrates, but the two major categories are rigid and tape substrates. As their names imply, these two categories differ with respect to their mechanical properties. Rigid substrates have a fixed shape and form, while tape substrates are thin and flexible. Early rigid substrates were mostly made of ceramic, but today organic substrates have become more widely deployed among various packages.

Rigid substrates that are composed of a stack of thin layers or laminates are called 'laminate' substrates. There are several different materials used for manufacturing laminate substrates. Two widely used materials for laminate substrates are FR4, a traditional epoxy-based laminate, and the more advanced and higher-performing resin-based Bismaleimide-Triazine (BT) from Mitsubishi Gas and Chemical.

BT resin has become the preferred laminate material for many manufacturers because of its high Tg, low dielectric constant and good insulation properties. In fact, BT is now apparently the standard substrate material for ball grid arrays (BGAs), and is also being used in chip scale package (CSP) laminates. Other types of laminate substrates are composed of advanced epoxies or epoxy blends. These are expected to give BT laminates some good competition that can lead to more reductions in substrate prices.

Tape substrates are composed of high-strength and high-temperature polymer material such as polyimide. One major advantage of tape substrates is quite obvious: it is compliant enough to be subjected to motion while carrying the circuits built onto them, which is useful in 'moving' applications such as disk drives and printers. Tape substrates are also light-weight, less costly, and better than laminate substrates in achieving fine-line and microvia features, a fact that CSP's took advantage of in pursuit of fine-pitched wiring. The disadvantages of tape substrates include: 1) more difficult handling during processing; 2) warpage issues; and 3) large differences in coefficient of thermal expansion (CTE) with other materials such solder masks.

Aside from serving as a base for integrated circuit packages, substrates are also used to route the chip's I/O system to the application board's interconnection features. Thus, substrates must somehow have within themselves metal conductors that can accomplish this routing function. These are usually in the form of traces etched from copper foil that's bonded to one or more laminates of the substrate. The copper layers of the substrate are commonly finished with a layer of immersion gold over a layer of electroless nickel. The nickel prevents copper-solder interdiffusion while the gold inhibits oxidation and enhances solderability.

A laminate substrate can have several layers with metal planes or traces that are interconnected to each other by through-hole plated vias, in much the same way as conventional printed circuit boards. BT substrates often have an even number of routing layers. In a 4-layer substrate, for instance, the I/O routing planes are the ones at the top and bottom of the substrate, while the inner layers are used as a ground and power plane.

In one or more embodiments, a test interposer including solder bumps and an electrical equipment evaluation contact can be used to characterize the integrated circuit chip by attachment of the solder bump to the redundant signal bond pad on the chip, which as noted above is connected to the same signal port as that of the signal bond pads. Assuming the chip characteristics are satisfactory and within the desired specifications, the chip can then be attached to a final interposer via the at least one final signal bond pad with the highest reliability connection since both the final bumped interposer and the at least one signal bond pad on the integrated circuit chip have not been reworked, thereby eliminating any damage that can have been caused during testing via the redundant signal bond pad using the bumped test interposer.

In this manner, the integrated circuit chip can be powered up and electrically tested at elevated temperatures to stress the chip to detect early failures and subsequently removed from the test interposer with no damage to the chip signal bond pad and without the need to rework the solder bump on the test interposer. The chip can then be attached via the signal bond pad to a final interposer or the like, which is connected to the same single port as the redundant signal bond pad. Consequently, any permanent damage to the redundant signal bond pad resulting from removal of the test interposer is of no consequence since its only purpose is to provide test characterization of the chip. The at least one signal pad has never been bonded to a solder bump (or directly tested via a probe, wirebond or the like) and the final interposer is also pristine. The combination results in the highest reliability connection of the chip to the final interposer, regardless of the ability to cleanly rework the bump bond connections or the like.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements can be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming the same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that can require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Turning now to FIG. 1, there is shown a sectional view depicting an integrated circuit chip 10 to be tested (subsequent to dicing) and a test interposer 50 in accordance with one or more embodiments of the present invention. The integrated circuit chip 10 includes a substantially planar structure 12 having an outer periphery 14. The integrated circuit chip includes at least one redundant signal bond pad 16 and at least one signal bond pad 18 thereon, wherein the at least one redundant signal bond pad 16 and the at least one final signal bond pad 18 are connected to the same signal port (not shown). Moreover, the redundant signal bond pads are generally located such that damage during the testing to the signal bond pad does not occur. For example, probing the redundant signal bond pad must be done without fear of damaging the final signal bond pad by contacting it. Probing typically involves some skidding during landing to scratch through a surface oxide that can be formed on the redundant signal bond pad so bump location should be considered to address this. This would mean the arrangement of the redundant signal bon pad would not place the final signal bond pads directly in line with the test redundant signal bond pads in order to avoid damage from any skidding that can occur during testing.

In one or more embodiments, the size of the redundant signal bond pads 16 can be different from the size of the signal bond pad 18. Moreover, the general size of the signal bond pads, i.e., redundant and final signal bond pads, will generally depend on the electrical test method. For example, signal bonds pads configured for testing by a probe can be small, e.g., in some cases as small as 30×30 microns (μm). Additionally, the signal bond pads configured for probe contact can be asymmetrical (i.e., not square or circular) as well. In contrast, the signal bond pads configured for bump bonding are typically circular and often times larger and can range from 50 μm to 500 μm.

In one or more embodiments, the lateral width of the redundant signal bond pads 16 are greater than the single bond pad 18 to facilitate ease in providing probe contact during testing, for example.

In one or more embodiments, the redundant signal bond pads 16 and the final signal bond pads 18 are formed of a superconducting metal. The superconducting metals can be deposited without previous treatment by evaporation, sputtering or by electroplating. The superconducting metals utilized herein are not intended to be limited and can include aluminum, carbon, gallium, hafnium, indium, iridium, lanthanide, molybdenum, niobium, rhenium, ruthenium, tin, tantalum, titanium, tungsten, vanadium, zinc, zirconium, alloys thereof, and the like.

The test interposer 50, when indicated, includes a substantially planar structure 52 having an outer periphery 54. Electrically conductive vias (not shown) are formed substantially through a central region of the substantially planar structure 52. An electrically conductive trace (not shown) extends from selected ones of the electrically conductive vias toward the outer periphery 54 (i.e., through a peripheral region of substantially planar structure 52) to a test pad 56, which is also referred to as an electrically conductive pad, disposed proximate the outer periphery 54. The test pad 56 includes a solder bump 58 coupled thereto for bump bonding to the redundant signal bond pad as will be described in greater detail below.

The substantially planar structure 52 of the test interposer 50 is configured to have a sufficient surface area, relative to the surface area of a semiconductor die 10 to be aligned and electrically coupled with the redundant signal bond pad and to accommodate the desired number of test pads 56 proximate the outer periphery 54. The substantially planar structure 52 is also configured to have a sufficient surface area outside the perimeter of the chip 10 to facilitate access by electrical evaluation equipment to test pads 56.

The redundant signal bond pad 16 is aligned with the solder bump 58 on the test pad 56 followed by thermal compression bonding including applied heat and pressure to facilitate electrical connection of the solder bump 58 on the test interposer 50 to the redundant single pad 16 on the chip 10, which permits the chip to be tested via the redundant signal bond pad. The measured characteristics of the chip 10 can then be analyzed using the electrical evaluation equipment to determine if chip performance is within the desired specifications.

The electrical evaluation equipment can include a testing socket 60 as shown to connect to the redundant signal bond pads 16 on the chip 10 through one or more multiplexers (not shown). The multiplexer could be built into the interposer 50 as a standard surface mount device or could be a separate component or set of components. The multiplexer could be powered by the test apparatus or from the bias voltage powering the semiconductor chips 10.

Generally, in the testing process the integrated circuit chip is powered, e.g., between inputs of VDD or Vcc, and ground, and subjected to various logic and memory tests and to thermal loads. After testing, the chips 10 and the test interposer 50 are separated.

In order to remove the chip, care must be taken so that only a small amount of material remains on the chip, so as to not interfere with the final bond. This can be accomplished by selecting an under bump metallization layer (UBM) that only partially wets in order to not transfer much material to the chip test pad. In other embodiments, reflowing the integrated circuit chip after debonding can be done in order to smooth out the transfer material and ensure no 'whiskers' or protruding solder remains, which can cause packaging problems at final bond to the integrated circuit chip. For example, in the case of the bump bond pad attachment as described above, heat can be applied to the chip to facilitate removal. In an exemplary embodiment, the integrated circuit chip 10 can be removed by drawing a vacuum over the chip and high pressure, e.g., about 10 to 50 or more pounds per square inch (gauge) is applied through the pressure line. The combination of vacuum applied to the top surface of the integrated circuit chip and high pressure applied to the bottom of the integrated circuit chip, forces the chip upward from the test interposer for easy removal.

For wirebonding, the bonds must be broken and removed from the test chip so as to not interfere with the final bonding. With a probe, the chip will be simply removed from the probe fixture.

After the chip is removed from the fixture, there will be a need to clean the chip to allow a good permanent bond to the final interposer. Depending on the device and probing method, example cleans could include solvents, or a dilute protic acid solution such as dilute hydrochloric acid (HCl), dilute hydrofluoric acid (HF), or the like. The individual integrated circuit chips are then separated into defective chips, which are discarded, and chips for placement on a final interposer and printed circuit board, card, or other substrate.

Figure 2:
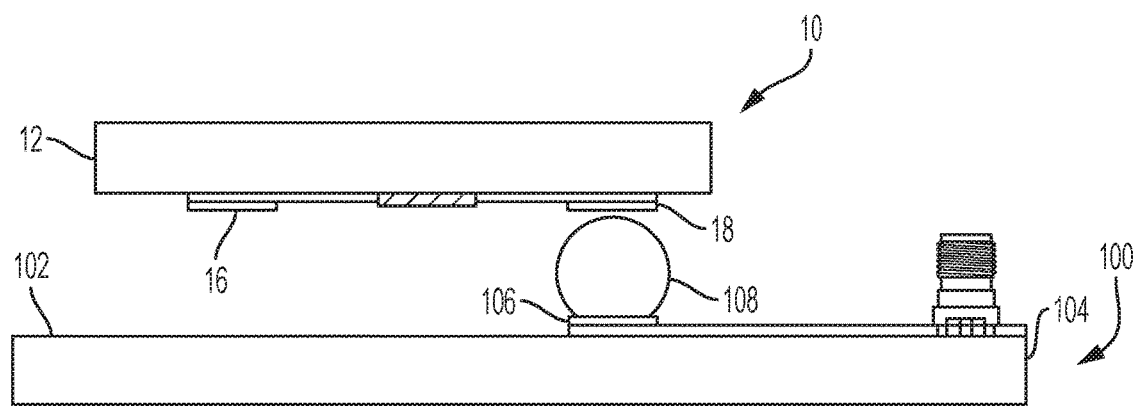
FIG. 2 is a sectional view depicting a semiconductor device after a fabrication operation according to embodiments of the invention.

In FIG. 2, there is shown a sectional view depicting the previously tested and qualified integrated circuit chip 10 and a final interposer 100. The final interposer 100 includes a substantially planar structure 102 having an outer periphery 104. Electrically conductive vias (not shown) are formed substantially through a central region of substantially planar structure 102. An electrically conductive trace (not shown) extends from selected ones of the electrically conductive vias toward the outer periphery 104 (i.e., through a peripheral region of substantially planar structure 102) to an electrically conductive pad 106 disposed proximate the outer periphery 104. Similar in structure to the test interposer, the final interposer 100 includes a solder bump 108 coupled to the electrically conductive pad 106.

The substantially planar structure 102 is configured to have a sufficient surface area, relative to the surface area of a semiconductor die 10 to be aligned and assembled therewith, to accommodate the number of pads 106 proximate outer periphery 104 such that each of electrically conductive pads 106 is at least partially exposed outside a periphery of semiconductor die 10. Heat and pressure are applied to the aligned integrated circuit chip 10 and final interposer 100 to facilitate electrical connection of a solder bump 108 on the final interposer to the signal bond pad on the chip 10.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of packaging an integrated circuit chip, comprising:
    fabricating an integrated circuit chip comprising at least one redundant signal bond pad and at least one final signal bond pad, wherein the at least one redundant signal bond pad and at least one final signal bond pad are connected to a common signal port;
    providing a test interposer including a test socket in electrical communication with a bond pad including a solder bump thereon, wherein the test socket is coupled to an electrical evaluation device in electrical communication with the at least one redundant signal bond pad;
    aligning the at least one redundant signal bond pad of the integrated circuit chip with the solder bump on the test interposer and subjecting the chip and test interposer to thermal compression bonding to bond the solder bump to the chip redundant bond pad;
    electrically testing the integrated circuit chip with the electrical evaluation device;
    removing the test interposer from the chip by heating the integrated circuit chip to a temperature effective to reflow the solder bump; and
    attaching the integrated circuit chip to a final interposer, wherein the final interposer includes a solder bump disposed on a final signal bond pad thereon and the signal bond pad on the integrated circuit chip is thermally compression bonded to the solder bump.

2. The method of claim 1, wherein the at least one redundant signal bond pad and the at least one signal bond pad on the chip are formed of a superconducting material.

3. The method of claim 1, wherein the at least one redundant signal bond pad and the at least one signal bond pad are of different sizes.

4. The method of claim 1, wherein the solder bump on the test interposer is electrically coupled to the test socket formed on about an end perimeter surface of the test interposer.

* * * * *